(12) United States Patent
Elsherbini et al.

(10) Patent No.: US 11,417,593 B2
(45) Date of Patent: Aug. 16, 2022

(54) DIES WITH INTEGRATED VOLTAGE REGULATORS

(71) Applicant: Intel Corporation, Santa Clara, CA (US)

(72) Inventors: Adel A. Elsherbini, Chandler, AZ (US); Krishna Bharath, Phoenix, AZ (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 16/140,195

(22) Filed: Sep. 24, 2018

(65) Prior Publication Data

US 2020/0098676 A1    Mar. 26, 2020

(51) Int. Cl.
*H01L 23/498* (2006.01)
*H01L 23/00* (2006.01)
*H01L 23/522* (2006.01)
*H01L 23/36* (2006.01)

(52) U.S. Cl.
CPC ........ *H01L 23/49822* (2013.01); *H01L 23/36* (2013.01); *H01L 23/5223* (2013.01); *H01L 23/5227* (2013.01); *H01L 24/33* (2013.01); *H01L 2924/1427* (2013.01)

(58) Field of Classification Search
CPC .............. H01L 23/49822; H01L 23/36; H01L 23/5223; H01L 24/33; H01L 2924/1427; H01L 21/76822; H01L 21/76832; H01L 21/76837
See application file for complete search history.

(56) References Cited

U.S. PATENT DOCUMENTS

| | | | |
|---|---|---|---|
| 7,679,344 B2 | 3/2010 | Carlson et al. | |
| 8,335,084 B2 | 12/2012 | Lee et al. | |
| 8,692,368 B2 | 4/2014 | Pan et al. | |
| 9,229,466 B2 | 1/2016 | Saraswat et al. | |
| 2014/0217547 A1 | 8/2014 | Elsherbini et al. | |
| 2014/0264732 A1 | 9/2014 | Elsherbini et al. | |
| 2015/0235753 A1 | 8/2015 | Chatani et al. | |
| 2017/0092412 A1 | 3/2017 | Manusharow et al. | |
| 2017/0221858 A1 | 8/2017 | Yu et al. | |
| 2019/0013353 A1* | 1/2019 | Lee | ......................... H01L 43/12 |
| 2019/0054211 A1 | 2/2019 | Alsberg | |
| 2020/0098621 A1* | 3/2020 | Bharath | .............. H01L 25/0655 |

* cited by examiner

Primary Examiner — Nicholas J Tobergte
(74) Attorney, Agent, or Firm — Akona IP PC

(57) ABSTRACT

Microelectronic assemblies, related devices and methods, are disclosed herein. In some embodiments, a microelectronic assembly may include a die, having an active surface and an opposing backside surface, including a plurality of through silicon vias (TSVs); and an inductor including a first conductive pillar with a first end and an opposing second end, wherein the first end of the first conductive pillar is coupled to the backside surface of a first individual TSV; a second conductive pillar with a first end and an opposing second end, wherein the first end of the second conductive pillar is coupled to the backside surface of a second individual TSV, wherein the second end of the second conductive pillar is coupled to the second end of the first conductive pillar, and wherein the first and the second conductive pillars are at least partially surrounded in a magnetic material.

25 Claims, 13 Drawing Sheets

500G

DIES WITH INTEGRATED VOLTAGE REGULATORS

BACKGROUND

Integrated circuit (IC) packages may include integrated voltage regulators (IVRs) for managing power delivery to IC dies. Some IVRs may include discrete inductors and capacitors embedded in or surface mounted on the package substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
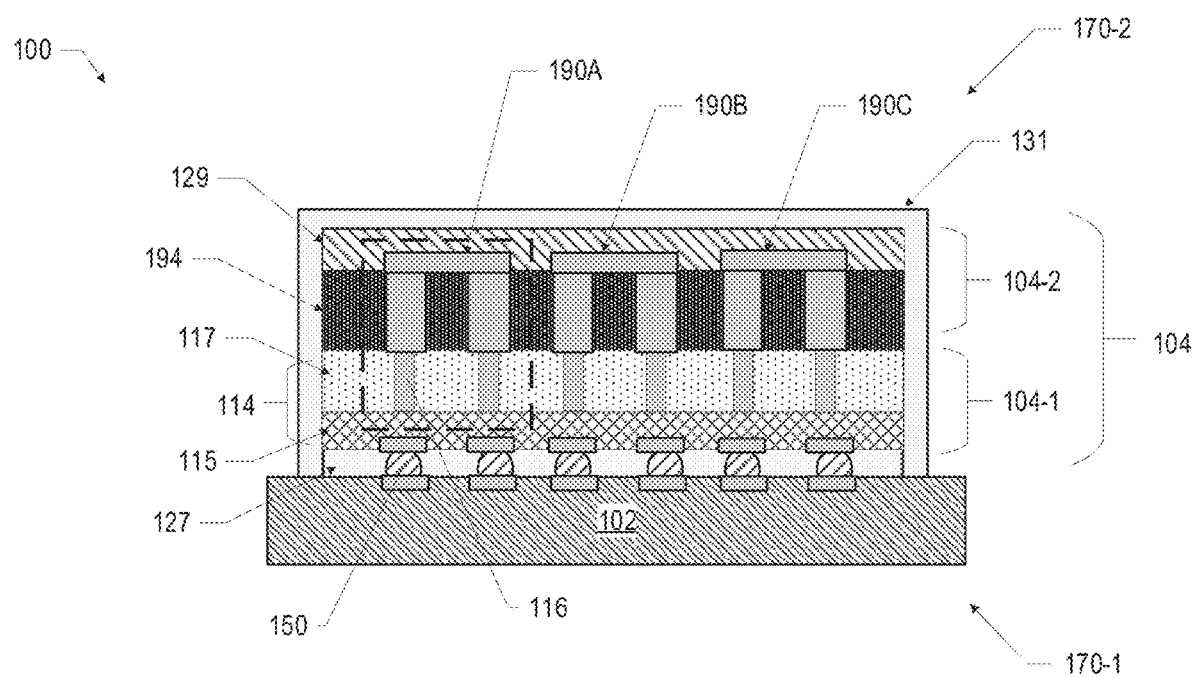
FIG. 1A is a side, cross-sectional view of an example microelectronic assembly, in accordance with various embodiments.

Microelectronic assemblies, and related devices and methods, are disclosed herein. For example, in some embodiments, a microelectronic assembly may include a die, having an active surface and an opposing backside surface, including a plurality of through silicon vias (TSVs) connecting the active surface and the backside surface of the die; and an inductor having a first conductive pillar having a first end and an opposing second end, wherein the first end of the first conductive pillar is electrically coupled to the backside surface of a first individual TSV of the plurality of TSVs; a second conductive pillar having a first end and an opposing second end, wherein the first end of the second conductive pillar is electrically coupled to the backside surface of a second individual TSV of the plurality of TSVs, wherein the second end of the second conductive pillar is electrically coupled to the second end of the first conductive pillar, and wherein the first conductive pillar and the second conductive pillar of the inductor are at least partially surrounded by a magnetic material.

Communicating large numbers of signals between two or more dies in a multi-die IC package is challenging due to the increasingly small size of such dies, thermal constraints, and power delivery constraints, among others. IVRs are commonly used in electronics and communications applications to regulate voltage for power delivery, and may include inductors and capacitors disposed on a package substrate and implemented using conductive pathways in the package substrate. Conventional IVRs, such as Buck regulators, typically include a voltage input, a voltage output, an input capacitor, an output capacitor, an inductor, switching transistors and/or diodes and a control having a plurality of transistors to perform voltage regulation and to control the inductor. In conventional IVRs, one or more of the components may be embedded in a package substrate or surface mounted on a package substrate, which increases the package substrate area and adds latency due to the increased signal distance. Various ones of the embodiments disclosed herein may improve IC package performance with greater design flexibility, at a lower cost, and/or with a reduced size relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. For convenience, the phrase "FIG. 5" may be used to refer to the collection of drawings of FIGS. 5A-5G, the phrase "FIG. 6" may be used to refer to the collection of drawings of FIGS. 6A-6G, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1A is a side, cross-sectional view of a microelectronic assembly 100, in accordance with various embodiments. The microelectronic assembly 100 may include a package substrate 102 on a bottom surface 170-1 coupled to a multi-layer die subassembly 104 having integrated magnetic core inductors ("MCI") 190 on a top surface 170-2. In some embodiments, the microelectronic assembly 100 may include a silicon/glass interposer (not shown) coupled to a multi-layer die subassembly 104 having MCIs, and the silicon/glass interposer may be coupled to a package substrate or a circuit board. As used herein, the term a "multi-layer die subassembly" 104 may refer to a composite die including two layers; a first layer 104-1 having a die with a plurality of TSVs 116 and a second layer 104-2 having one or more MCIs 190 embedded in a magnetic material 194 and electrically coupled to the plurality of TSVs 116. As used herein, the terms a "multi-layer die subassembly" and a "composite die" may be used interchangeably.

The first layer 104-1 may include a die 114 having an active layer 115 and a backside layer 117. The active layer 115 of the die 114 is the surface containing one or more active devices. In some embodiments, the active layer 115 of the die 114 may include active and passive circuitry (e.g., transistors, diodes, resistors, inductors, and capacitors, among others). In some embodiments, the active layer 115 of the die 114 may include one or more device layers including transistors (e.g., as discussed below with reference to FIG. 9). The active layer 115 of the die 114 may be coupled to the package substrate 102 via first level interconnects (FLIs) 150. In some embodiments, the FLIs 150 may have a pitch between 10 microns and 800 microns (e.g., between 100 microns and 500 microns). The backside layer 117 of the die 114 may include a plurality of TSVs 116 that extend through the backside layer (e.g., extend from the top surface of the active layer 115 to the top surface of the backside layer 117). The TSVs 116 may form surface connections on the top surface of the backside layer 117. The TSVs 116 may include a conductive material, such as a metal, and may be isolated from the surrounding silicon or other semiconductor material by a barrier oxide. Power, ground, and/or signals may be transmitted between the package substrate 102 and the die 114 by the TSVs and other conductive pathways. The second layer 104-2 may include one or more MCIs 190, where the MCIs 190 are electrically coupled to the TSVs 116 in the backside layer 117 of the die 114.

Although FIG. 1A shows a particular arrangement of a microelectronic assembly 100 including a three MCIs 190, a microelectronic assembly 100 may include any number and arrangement of MCIs 190. For example, a microelectronic assembly 100 may include one MCI or four or more MCIs. In some embodiments, a microelectronic assembly 100 may include thirty or more MCIs. In some embodiments, a microelectronic assembly may include one hundred or more MCIs. As shown in FIG. 1A, the three MCIs are two-terminal MCIs, which include a first and a second conductive pillar surrounded by magnetic material and coupled via a conductive pathway. In some embodiments, two or more two-terminal MCIs may be magnetically coupled and may function as a transformer having at least four terminals. A transformer may include three or more terminals coupled via alternating top and bottom conductive pathways. For example, a first two-terminal MCI and a second two-terminal MCI may be positioned in close proximity, such that the magnetic fields of the first MCI and the second MCI are coupled (e.g., in the same direction or positive coupling) and/or anti-coupled (e.g., in opposite directions or negative coupling). As used herein, the two MCIs are positioned in close proximity when a distance between the second conductive pillar of the first MCI and the first conductive pillar of the second MCI is between 50 microns and 4000 microns (e.g., the greatest distance is no more than four times the largest pitch between conductive pillars, where the largest pitch is 1000 microns).

Figure 1B:
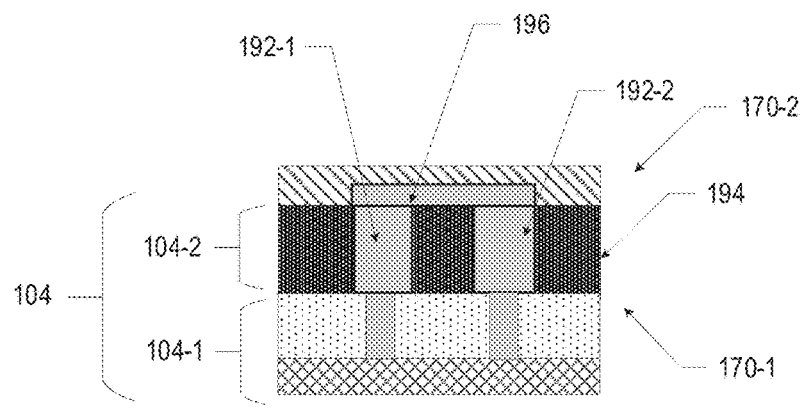
FIG. 1B is a magnified portion of FIG. 1A, in accordance with various embodiments.

FIG. 1B is a magnified portion of FIG. 1A, in accordance with various embodiments. As shown in FIG. 1B, the MCI 190A may include a first conductive pillar 192-1 and a second conductive pillar 192-2 embedded in or surrounded by a magnetic material 194. The MCI 190A may have a first surface (e.g., at a bottom surface 170-1) and a second surface (e.g., at a top surface 170-2). The first conductive pillar 192-1 may be electrically coupled to the second conductive pillar 192-2 via a conductive pathway 196 at the second surface (e.g., at a top surface 170-2).

The conductive pillars 192 of the MCI 190 may be formed of any appropriate conductive material, such as copper, silver, nickel, gold, aluminum, or other metals or alloys, for example. The conductive pillars 192 of the MCI 190 may be formed using any suitable process, including, for example, the process described with reference to FIG. 5. In some embodiments, the conductive pillars 192 disclosed herein may have a pitch between 50 microns and 1000 microns. As used herein, pitch is measured center-to-center (e.g., from a center of a conductive pillar to a center of an adjacent conductive pillar). The conductive pillars 192 of the MCI 190 may have any suitable size and shape. In some embodiments, the conductive pillars 192 may have a circular, rectangular, or other shaped cross-section. In some embodiments, the conductive pillars 192 may have a thickness (e.g., z-height) between 50 microns and 1000 microns and a cross-section between 20 and 500 microns.

The magnetic material 194 surrounding the conductive pillars 192 may be formed of any suitable magnetic material, for example, a ferromagnetic material. In some embodiments, suitable magnetic materials may include iron, nickel, cobalt, or nickel-iron alloys (e.g., Mu metals and/or permalloys). In some embodiments, suitable magnetic materials may include lanthanide and/or actinide elements, cobalt-zirconium-tantalum (CZT) alloy, semiconducting or semimetallic Heusler compounds, and non-conducting (ceramic) ferrites. In some embodiments, suitable ferrite materials may include any of nickel, manganese, zinc, and/or cobalt cations, in addition to iron. In some embodiments, ferrite materials may include barium and/or strontium cations. In some embodiments, suitable Heusler compounds may include any of manganese, iron, cobalt, molybdenum, nickel, copper, vanadium, indium, aluminum, gallium, silicon, germanium, tin, and/or antimony. In some embodiments, suitable magnetic materials may include Heusler alloy, Co, Fe, Ni, Gd, B, Ge, Ga, permalloy, or yttrium iron garnet (YIG), where the Heusler alloy is a material which includes one or more of: Cu, Mn, Al, In, Sn, Ni, Sb, Ga, Co, Fe, Si, Pd, Sb, V, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge. In some embodiments, suitable magnetic materials may include Pt, Pd, W, Ce, Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fe_2O_3$, Nd, $Nd_2O_3$, $KO_2$, Pr, Sm, $Sm_2O_3$, Tb, $Tb_2O_3$, Tm, $Tm_2O_3$, V, $V_2O_3$ or epoxy material with particles of a magnetic alloy. In some embodiments, a magnetic alloy can be an alloy formed of one or more of: Pt, Pd, W, Ce, Al, Li, Mg, Na, Cr, Co, Dy, Er, Eu, Gd, Fe, Nd, K, Pr, Sm, Tb, Tm, or V. In some embodiments, a magnetic material may be formed of a dielectric with magnetic particles or flakes. For example, a non-conductive organic or inorganic material may have magnetic particles or flakes, such as iron, nickel, cobalt, and their alloys, where the magnetic particles have a diameter between 5 nanometers and 500 nanometers, and are distributed throughout the dielectric material. In some embodiments, the magnetic material used may depend on the desired characteristics for a particular MCI. For example, in some embodiments, a highly permeable magnetic material that may saturate under relatively light loads may be used to create MCIs for IVRs that supply light loads at high efficiency. In some embodiments, a magnetic material having lower permeability with a high saturation point may be used to create MCIs for IVRs that supply heavier loads.

The magnetic material 194 may be formed using any suitable process, including, for example, the process described below with reference to FIG. 5. In some embodiments, a magnetic material 194 may be formed to at least partially surround or partly embed a conductive pillar 192 (e.g., partly surround the conductive pillar along a height (e.g., z-height or thickness) and/or partly around a diameter). In some embodiments, the magnetic material 194 may be formed to wholly surround and/or fully embed the conductive pillar 192. In some embodiments, only one conductive pillar (e.g., the first conductive pillar) is surrounded by a magnetic material. In some embodiments, only some conductive pillars are surrounded by a magnetic material. In some embodiments, all conductive pillars are surrounded by a magnetic material. In some embodiments, surrounded by a magnetic material may refer to a conductive pillar embedded in a magnetic material.

The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 9. The conductive pathways in the dies 114 may be bordered by liner materials, such as adhesion liners and/or barrier liners, as suitable. In some embodiments, the die 114 is a wafer. In some embodiments, the die 114 is a monolithic silicon, a fan-out or fan-in package die, or a die stack (e.g., wafer stacked, die stacked, or multi-layer die stacked). For example, in a die stack, the stacked dies may include TSVs for forming connections between the die 114 (e.g., the bottom die) and the magnetic core inductors on the top surface of the die stack.

The microelectronic assembly 100 of FIG. 1A may also include a highly thermally conductive mold material or a thermal interface material (TIM) 129. The TIM 129 may include a thermally conductive material (e.g., metal particles) in a polymer or other binder. The TIM 129 may be a thermal interface material paste or a thermally conductive epoxy (which may be a fluid when applied and may harden upon curing, as known in the art). The TIM 129 may provide a path for heat generated by the die 114 and the MCIs 190 to readily flow to the heat spreader 131, where it may be spread and/or dissipated.

The microelectronic assembly 100 of FIG. 1A may also include a heat spreader 131. The heat spreader 131 may be used to move heat away from the die 114 and the MCIs 190 (e.g., so that the heat may be more readily dissipated by a heat sink or other thermal management device). The heat spreader 131 may include any suitable thermally conductive material (e.g., metal, appropriate ceramics, etc.), and may include any suitable features (e.g., fins). In some embodiments, the heat spreader 131 may be an integrated heat spreader.

The package substrate 102 may include an insulating material (e.g., a dielectric material formed in multiple layers, as known in the art) and one or more conductive pathways to route power, ground, and signals through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the package substrate 102 is formed using standard printed circuit board (PCB) processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

In some embodiments, the package substrate 102 may be formed using a lithographically defined via packaging process. In some embodiments, the package substrate 102 may be manufactured using standard organic package manufacturing processes, and thus the package substrate 102 may take the form of an organic package. In some embodiments, the package substrate 102 may be a set of redistribution layers formed on a panel carrier by laminating or spinning on a dielectric material, and creating conductive vias and lines by laser drilling and plating. In some embodiments, the package substrate 102 may be formed on a removable carrier using any suitable technique, such as a redistribution layer technique. Any method known in the art for fabrication of the package substrate 102 may be used, and for the sake of brevity, such methods will not be discussed in further detail herein.

In some embodiments, the package substrate 102 may be a lower density medium and the die 114 may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process.

The FLIs 150 disclosed herein may take any suitable form. In some embodiments, the FLIs 150 may include solder (e.g., solder bumps or balls that are subject to a thermal reflow to form the interconnects). In some embodiments, the FLIs 150 may include an anisotropic conductive material, such as an anisotropic conductive film or an anisotropic conductive paste. An anisotropic conductive material may include conductive materials dispersed in a non-conductive material.

The microelectronic assembly 100 of FIG. 1A may also include an underfill material 127. In some embodiments, the underfill material 127 may extend between the die 114 and the package substrate 102 around the associated FLIs 150. The underfill material 127 may be an insulating material, such as an appropriate epoxy material. In some embodiments, the underfill material 127 may include a capillary underfill, non-conductive film (NCF), or molded underfill. In some embodiments, the underfill material 127 may include an epoxy flux that assists with soldering the die 114 to the package substrate 102 when forming the FLIs 150, and then polymerizes and encapsulates the FLIs 150. The underfill material 127 may be selected to have a coefficient of thermal expansion (CTE) that may mitigate or minimize the stress between the die 114 and the package substrate 102 arising from uneven thermal expansion in the microelectronic assembly 100. In some embodiments, the CTE of the underfill material 127 may have a value that is intermediate to the CTE of the package substrate 102 (e.g., the CTE of the dielectric material of the package substrate 102) and a CTE of the die 114.

The microelectronic assembly 100 of FIG. 1A may also include a circuit board (not shown). The package substrate 102 may be coupled to the circuit board by second-level interconnects at the bottom surface of the package substrate 102. The second-level interconnects may be any suitable second-level interconnects, including solder balls for a ball grid array arrangement, pins in a pin grid array arrangement or lands in a land grid array arrangement. The circuit board may be a motherboard, for example, and may have other components attached to it. The circuit board may include conductive pathways and other conductive contacts for routing power, ground, and signals through the circuit board, as known in the art. In some embodiments, the second-level interconnects may not couple the package substrate 102 to a circuit board, but may instead couple the package substrate 102 to another IC package, an interposer, or any other suitable component. In some embodiments, the multi-layer die subassembly may not be coupled to a package substrate 102, but may instead be coupled to a circuit board, such as a PCB.

Many of the elements of the microelectronic assembly 100 of FIG. 1A are included in other ones of the accompanying figures; the discussion of these elements is not repeated when discussing these figures, and any of these elements may take any of the forms disclosed herein. Further, a number of elements are illustrated in FIG. 1A as included in the microelectronic assembly 100, but a number of these elements may not be present in a microelectronic assembly 100. For example, in various embodiments, the heat spreader 131, the TIM 129, and the underfill material 127 may not be included.

Figure 2:
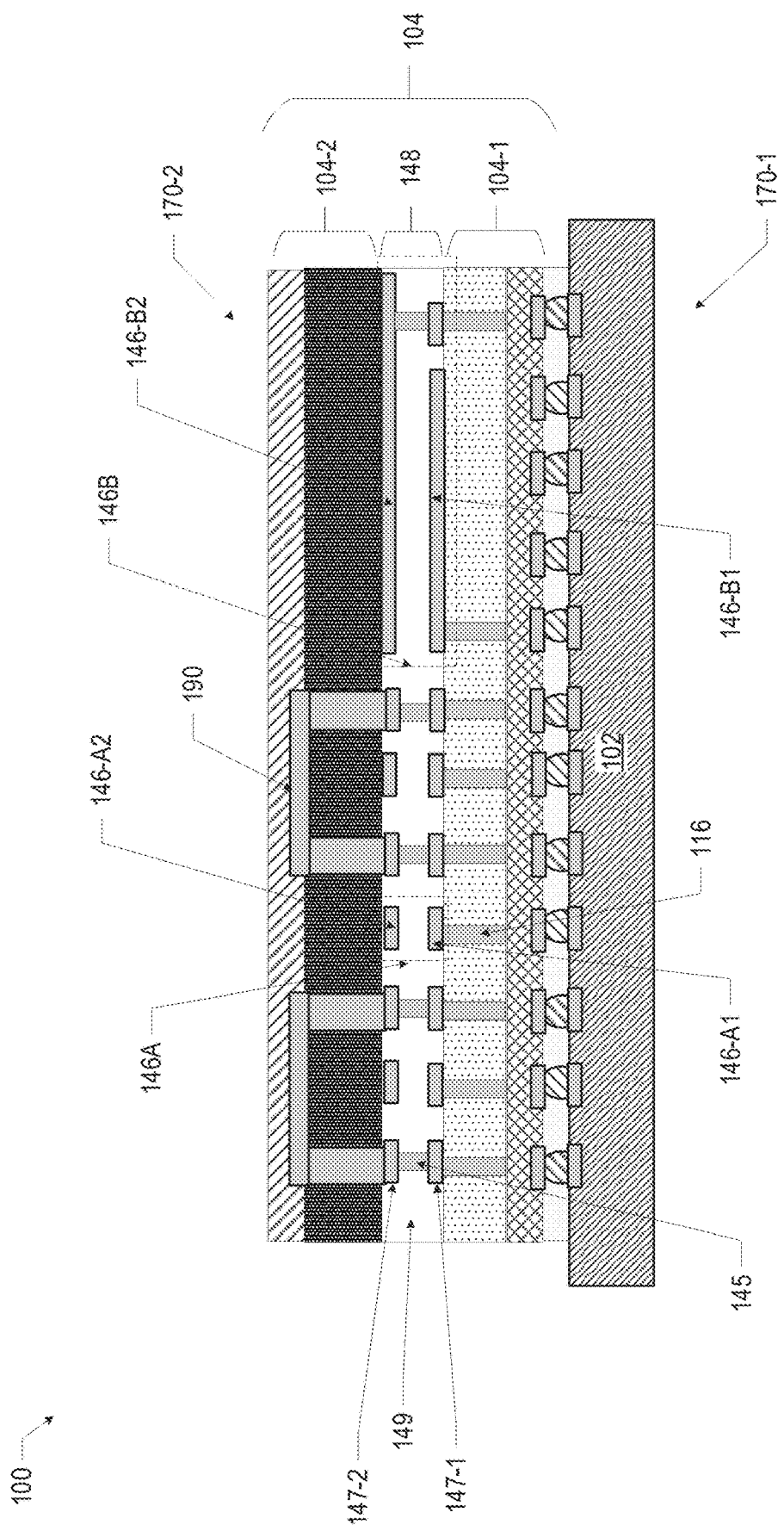
FIG. 2 is a side, cross-sectional view of an example microelectronic assembly, in accordance with various embodiments.

FIG. 2 is a side, cross-sectional view of another example microelectronic assembly, in accordance with various embodiments. In the microelectronic assemblies 100 disclosed herein, the multi-layer die subassembly 104 may include a capacitor layer 148, such as a metal-insulator-metal (MIM) capacitor layer. For example, FIG. 2 illustrates an embodiment of a microelectronic assembly 100 in which a multi-layer die subassembly 104 has a capacitor layer 148 between the first layer 104-1 and the second layer 104-2 (e.g., between the top surface of the backside layer 117 of the die 114 and the MCIs 190). The capacitor layer 148 may include a first metal layer 147-1, a dielectric layer 149, and a second metal layer 147-2 to form one or more capacitors 146A, 146B, as depicted by the dotted lines. The one or more capacitors may be integrated with the MCIs 190, as depicted for capacitor 146A, or may be separate from the MCIs 190, as depicted by capacitor 146B. The first metal layer 147-1 may function as a conductive contact for an MCI 190 or may function as a conductive contact for a capacitor bottom plate 146-A1, 146-B1. The second metal layer 147-2 may function as a conductive contact for an MCI 190 or may function as a conductive contact for a capacitor top plate 146-A2, 146-B2. As shown in FIG. 2, the MIM conductive contacts for an MCI 190 may be coupled by a conductive via 145.

The microelectronic assembly 100 may include one or more MCIs 190. The MCIs 190 may include two terminals (e.g., a first conductive pillar 192-1 and a second conductive pillar 192-2), where both the first and second conductive pillars are at least partially surrounded by magnetic material 194, and may be electrically coupled via a conductive pathway 196, as described above with reference to FIG. 1. In some embodiments, only the first conductive pillar may be at least partially surrounded by a magnetic material and not the second conductive pillar. In the microelectronic assemblies 100 disclosed herein, the multi-layer die subassembly 104 may include more than one capacitor layer 148.

Figure 3:
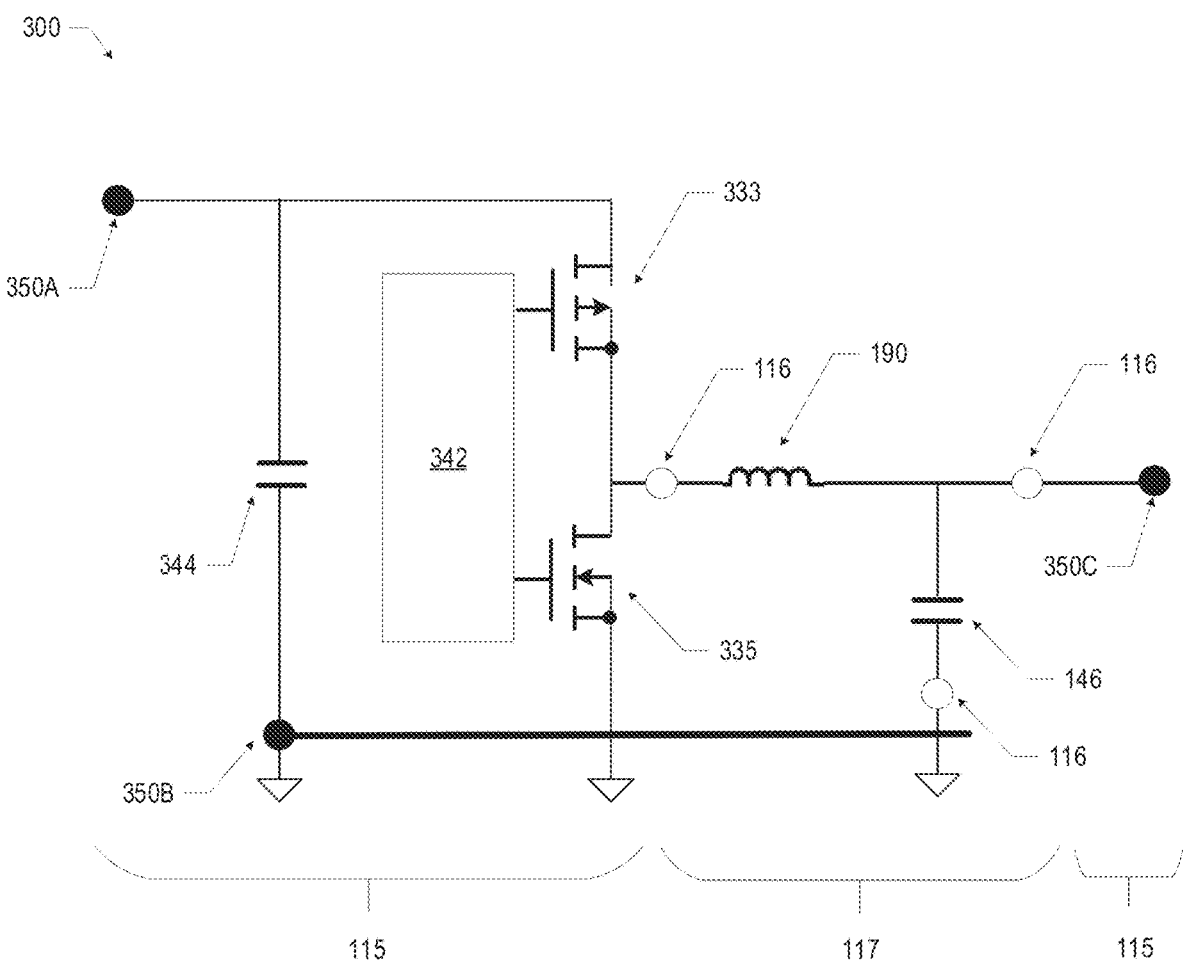
FIG. 3 is a simplified circuit diagram of an example IVR, in accordance with various embodiments.

FIG. 3 is a simplified circuit diagram of an example IVR that may be included in a microelectronic assembly 100, in accordance with various embodiments. The IVR 300 may include an input voltage 350A (e.g., voltage supply) through an FLI 150, an input capacitor 344, a control 342 with a first transistor 333 and a second transistor 335, a ground connection 350B through an FLI 150, and an output voltage 350C through an FLI 150 to the active layer 115 of the die 114, and an MCI 190, and an output capacitor 146 integrated on the backside layer 117 of the die 114. The MCI 190 and the output capacitor 146 may be coupled to the backside layer 117 of the die 114, as described above with reference to FIGS. 1 and 2, and may be connected to the active layer 115 of the die 114 via connections to the TSVs 116. The architecture of IVR 300 may include only three FLI 150 connections to the package substrate, which are the input voltage 350A, the ground connection 350B, and the output voltage 350C. In some embodiments, the IVR 300 further may be coupled to other external components, such as an external inductor and/or an external capacitor (e.g., an inductor or capacitor on the package substrate). As shown in FIG. 3, the first transistor 333 may be a p-type metal oxide semiconductor (PMOS) and the second transistor 335 may be an n-type metal oxide semiconductor (NMOS).

Figure 4:
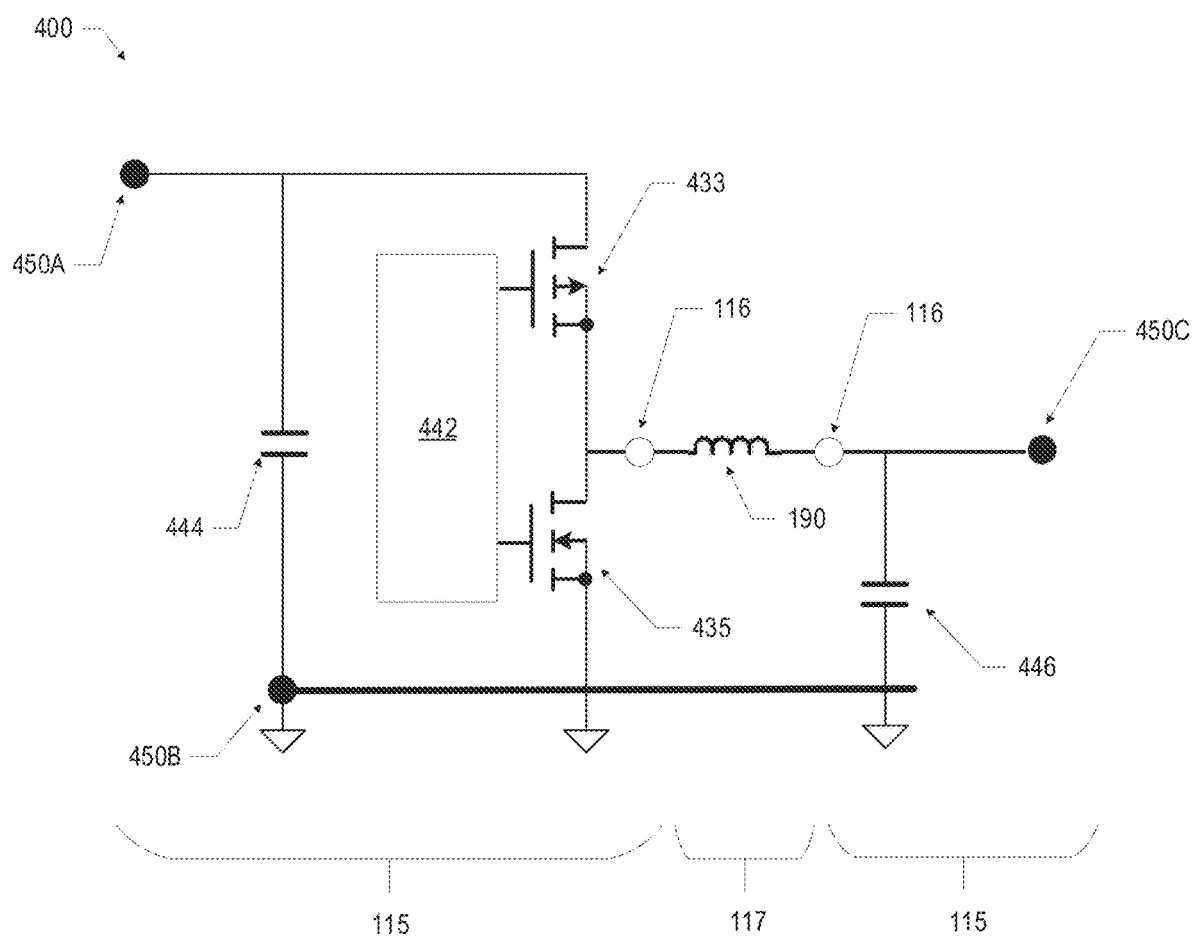
FIG. 4 is a simplified circuit diagram of another example IVR, in accordance with various embodiments.

FIG. 4 is a simplified circuit diagram of another example IVR that may be included in a microelectronic assembly 100, in accordance with various embodiments. The IVR 400 may include an input voltage 450A through an FLI 150, an input capacitor 444, a control 442 with a first transistor 433 and a second transistor 435, a ground connection 450B through an FLI 150, an output capacitor 446, and an output voltage 350C through an FLI 150 on the active layer 115 of the die 114, and an MCI 190 on the backside layer 117 of the die 114. The MCI 190 may be coupled to the TSVs 116 at the top surface of the backside layer 117, as described above with reference to FIG. 1, and may be connected to the active layer 115 of the die 114 via the connections to the TSVs 116. The architecture of IVR 400 may include only three FLI 150 connections to the package substrate, which are the input voltage 450A, the ground connection 450B, and the output voltage 450C. In some embodiments, the IVR 400 further may be coupled to other external components, such as an external inductor and/or an external capacitor (e.g., an inductor or capacitor on the package substrate).

Any suitable techniques may be used to manufacture the microelectronic assemblies disclosed herein. For example, FIGS. 5A-5G are side, cross-sectional views of various stages in an example process for manufacturing the microelectronic assembly 100 of FIG. 1A, in accordance with various embodiments. Although the operations discussed below with reference to FIGS. 5A-5G (and others of the accompanying drawings representing manufacturing processes) are illustrated in a particular order, these operations may be performed in any suitable order. Additionally, although particular assemblies are illustrated in FIGS. 5A-5G (and others of the accompanying drawings representing manufacturing processes), the operations discussed below with reference to FIGS. 5A-5G may be used to form any suitable assemblies.

Figure 5A:
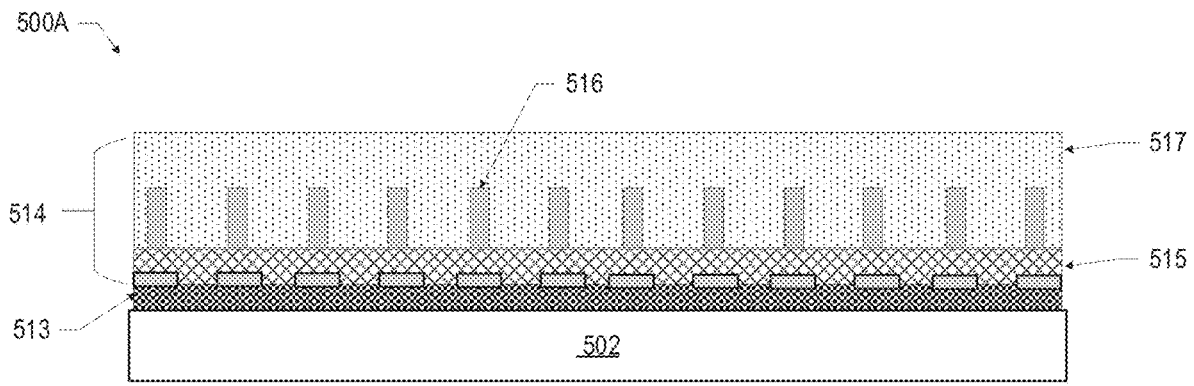
FIGS. 5A-5G are side, cross-sectional views of various stages in an example process for manufacturing the microelectronic assembly of FIG. 1A, in accordance with various embodiments.

FIG. 5A illustrates an assembly 500A including a carrier 502 on which an active wafer 514 is disposed. The active wafer 514 may include an active layer 515 facing the carrier 502 and a backside layer 517 having TSVs 516 facing away from the carrier 502. The carrier 502 may include any suitable material for providing mechanical stability during manufacturing operations. The active wafer 514 may be attached to the carrier 502 using any suitable technique, including a temporary adhesive layer 513 or a die attach film (DAF).

Figure 5B:
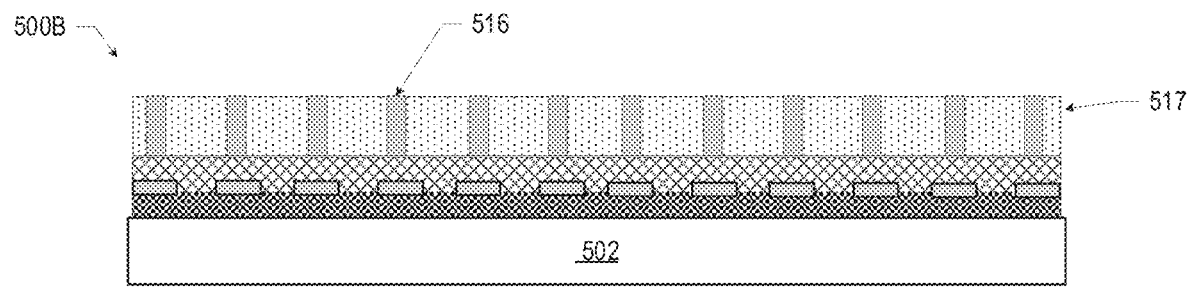

FIG. 5B illustrates an assembly 500B subsequent to removing non-electrical material from the backside layer 517 of the wafer 514 to expose the top surface of the TSVs 516. In some embodiments, the top surface of the TSVs 516 may be polished. The non-electrical material, which is an inactive portion of the wafer 514, may include silicon, ceramic, or quartz, among other materials. The non-electrical material may be removed using any suitable technique, including, for example, grinding, etching, such as reactive ion etching (RIE) or chemical etching.

Figure 5C:
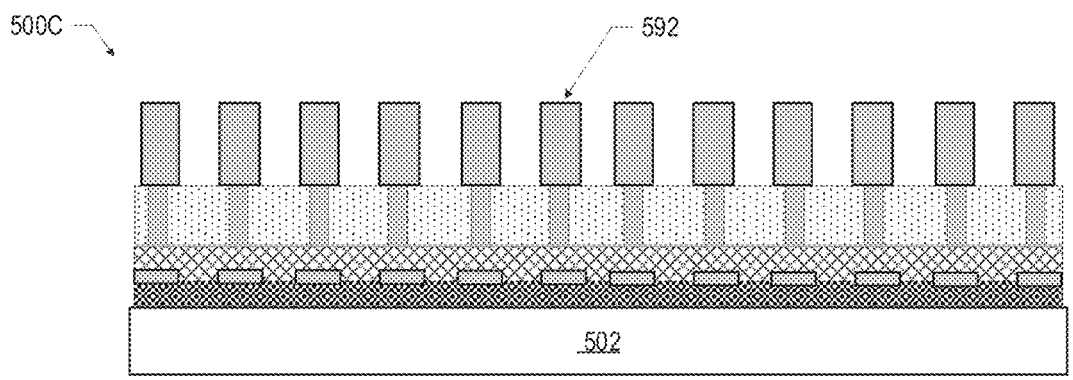

FIG. 5C illustrates an assembly 500C subsequent to forming conductive pillars 592 on the top surface of the TSVs 516. The conductive pillars 592 may take the form of any of the embodiments disclosed herein, and may be formed using any suitable technique, for example, a lithographic process or an additive process, such as cold spray or 3-dimensional printing. For example, the conductive pillars 592 may be formed by depositing, exposing, and developing a photoresist layer on the top surface of the TSVs 516. The photoresist layer may be patterned to form cavities in the shape of the conductive pillars. Conductive material, such as copper, may be deposited in the openings in the patterned photoresist layer to form the conductive pillars 592. The conductive material may be depositing using any suitable process, such as electroplating, sputtering, or electroless plating. The photoresist may be removed to expose the conductive pillars 592. In another example, a photo-imageable dielectric may be used to form the conductive pillars 592. In some embodiments, a seed layer (not shown) may be formed on the top surface of the TSVs prior to depositing the photoresist material and the conductive material. The seed layer may be any suitable conductive material, including copper. The seed layer may be removed, after removing the photoresist layer, using any suitable process, including chemical etching, among others. In some embodiments, the seed layer may be omitted.

The conductive pillars may have any suitable dimensions and may span one or more TSVs, as described below in FIG. 7. In some embodiments, an individual conductive pillar may have an aspect ratio (height:diameter) between 0.5:1 and 4:1 (e.g., between 1:1 and 3:1). In some embodiments, an individual conductive pillar may have a diameter between 10 microns and 300 microns. In some embodiments, an individual conductive pillar may have a diameter between 50 microns and 400 microns. In some embodiments, an individual conductive pillar may have a height between 100 and 500 microns. The conductive pillars may have any suitable cross-sectional shape, for example, square, triangular, and oval, among others.

Figure 5D:
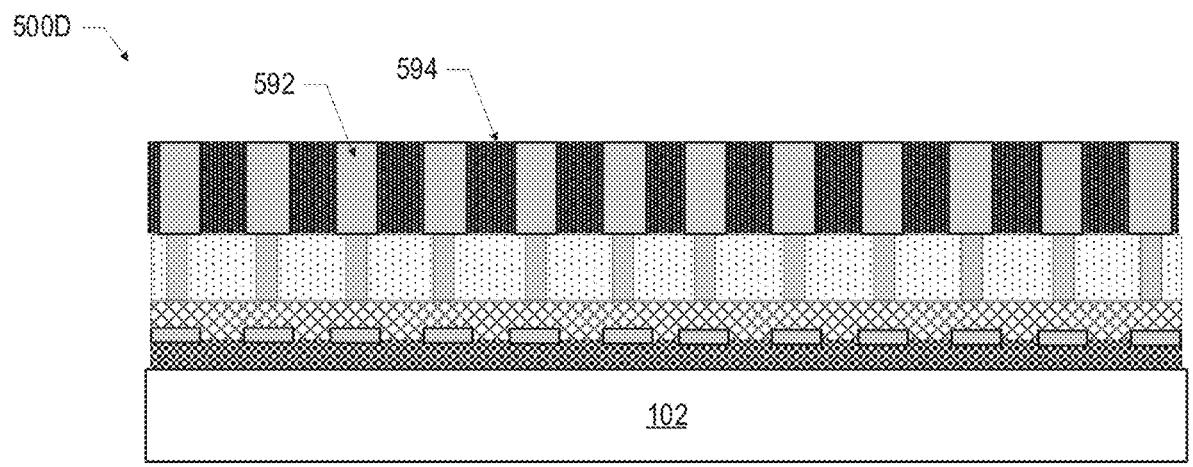

FIG. 5D illustrates an assembly 500D subsequent to providing a magnetic material 594 around the conductive pillars 592. The magnetic material 594 may be deposited using any suitable technique, such as compression molding, lamination, stencil printing, stenciless printing, electroplating, or sputtering. In some embodiments, the magnetic material is cured subsequent to deposition. In some embodiments, the magnetic material 594 may be initially deposited on and over the tops of the conductive pillars 592, then, polished back to expose the top surfaces of the conductive pillars 592. The technique used to deposit the magnetic material may depend on the type of magnetic material used. In some embodiments, the magnetic material used may depend on the desired characteristics for a particular MCI. The magnetic material 594 may be any suitable magnetic material as described above with reference to FIG. 1. In some embodiments, the magnetic material may be deposited around one conductive pillar or some (e.g., not all) conductive pillars.

Figure 5E:
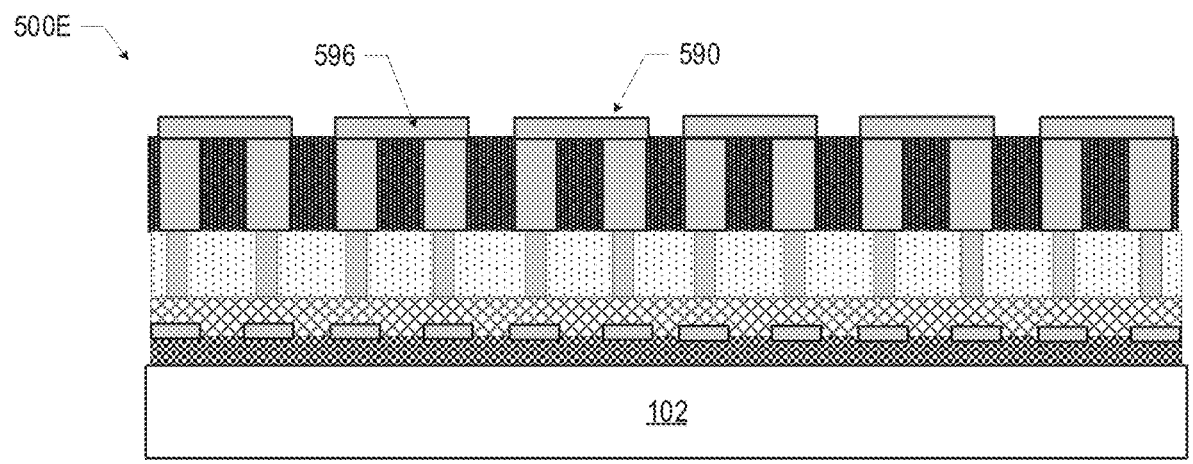

FIG. 5E illustrates an assembly 500E subsequent to forming conductive pathways 596 on the top surfaces of the conductive pillars 592 to form MCIs 590. The conductive pathways 596 may be formed using any suitable technique, for example, a lithographic process or an additive process, such as cold spray or 3-dimensional printing. For example, the conductive pathways 596 may be formed by depositing, exposing, and developing a photoresist layer on the top surface of the conductive pillars 592. The photoresist layer may be patterned to form cavities in the shape of the conductive pathways 596. Conductive material, such as copper, may be deposited in the openings in the patterned photoresist layer to form the conductive pathways 596. The conductive material may be depositing using any suitable process, such as electroplating, sputtering, or electroless plating. The photoresist may be removed to expose the conductive pathways 596.

Figure 5F:
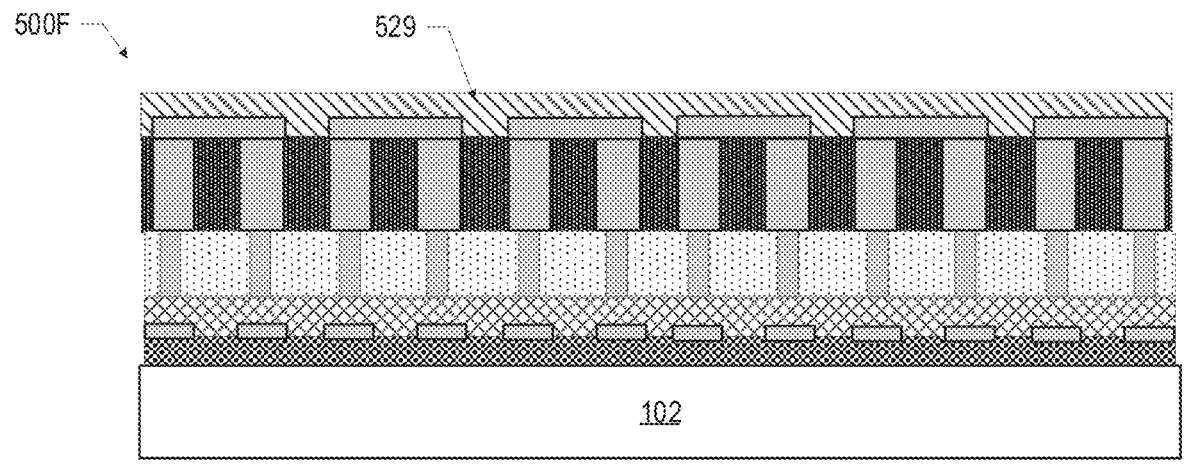

FIG. 5F illustrates an assembly 500F subsequent to providing a high thermally conductive material or TIM 529 on and over the conductive pathways 596. and top surface of the magnetic material 594. The TIM 529 may be formed using any suitable technique, including lamination, or slit coating and curing. The TIM 529 may be any suitable TIM material as described above with reference to FIG. 1.

Figure 5G:
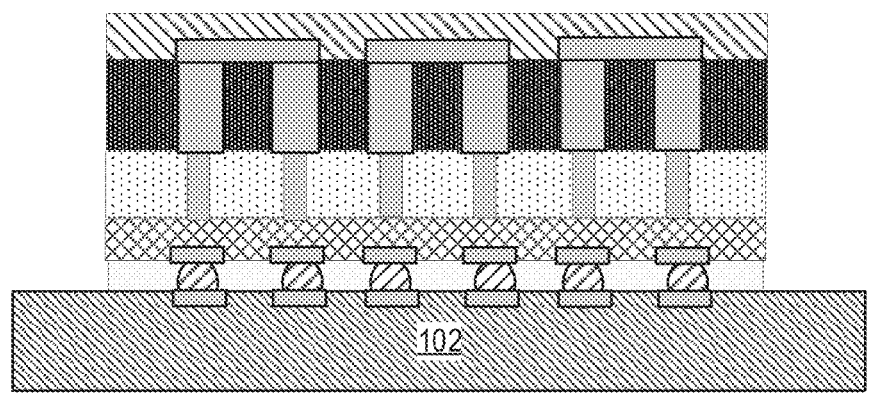

FIG. 5G illustrates an assembly 500G subsequent to removal of the carrier 502, singulating into individual units, and coupling to a package substrate 102. If multiple composite dies are manufactured together, the composite dies may be singulated after removal of the carrier 502. Further operations may be performed as suitable either before or after singulating (e.g., depositing a mold material, attaching a heat spreader, depositing a solder resist layer, attaching solder balls for coupling to a package substrate or to a circuit board, etc.).

FIGS. 6A-6G are side, cross-sectional views of various stages in an example process for manufacturing the microelectronic assembly 100 of FIG. 2, in accordance with various embodiments. Although the operations discussed below with reference to FIGS. 6A-6G (and others of the accompanying drawings representing manufacturing processes) are illustrated in a particular order, these operations may be performed in any suitable order. Additionally, although particular assemblies are illustrated in FIGS. 6A-6G (and others of the accompanying drawings representing manufacturing processes), the operations discussed below with reference to FIGS. 6A-6G may be used to form any suitable assemblies.

Figure 6A:
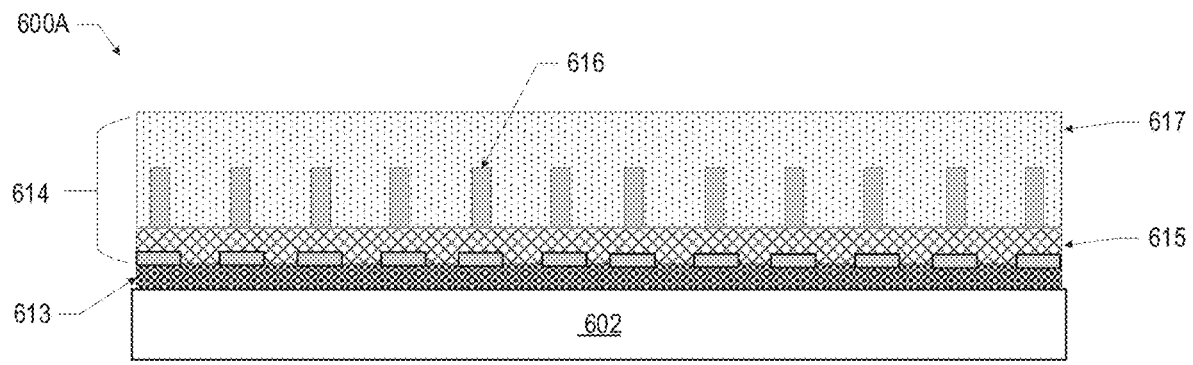
FIGS. 6A-6G are side, cross-sectional views of various stages in an example process for manufacturing the microelectronic assembly of FIG. 2, in accordance with various embodiments.

FIG. 6A illustrates an assembly 600A including a carrier 602 on which an active wafer 614 is disposed. The active wafer 614 may include an active layer 615 facing the carrier 602 and a backside layer 617 having TSVs 616 facing away from the carrier 602. The carrier 502 may include any suitable material for providing mechanical stability during manufacturing operations. The active wafer 614 may be attached to the carrier 602 using any suitable technique, including a temporary adhesive layer 613 or a DAF.

Figure 6B:
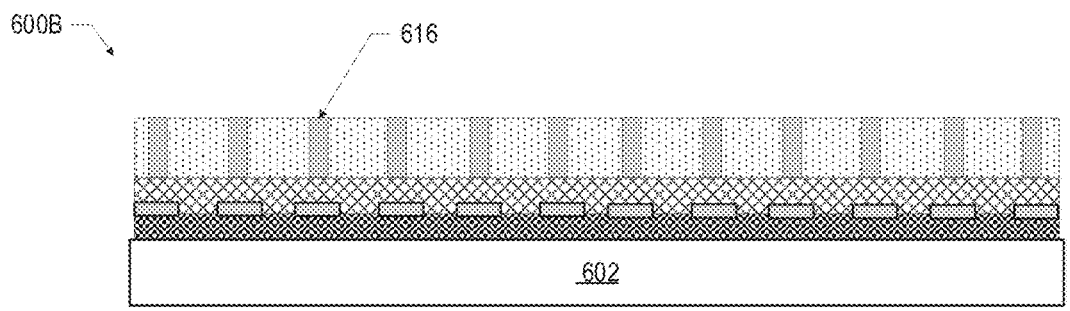

FIG. 6B illustrates an assembly 600B subsequent to removing non-electrical material from the backside layer 617 of the wafer 614 to expose the top surface of the TSVs 616, and, optionally, polishing the exposed surface, as described above with reference to FIG. 5.

Figure 6C:
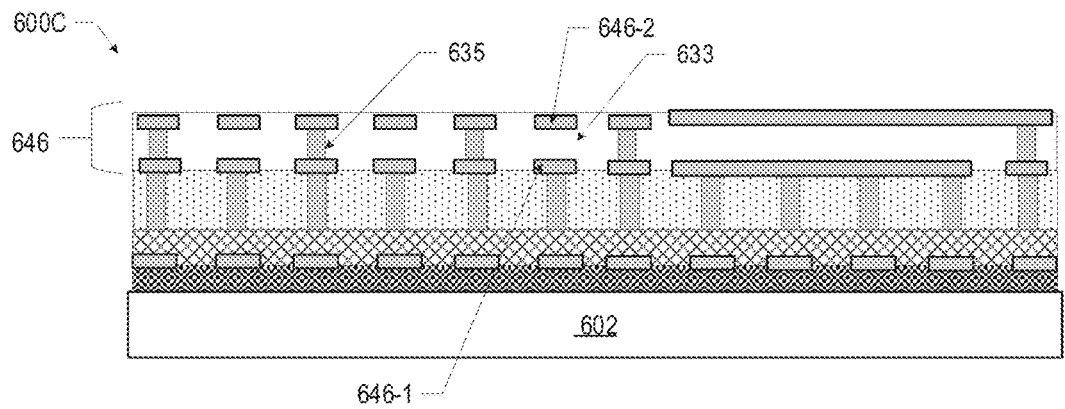

FIG. 6C illustrates an assembly 600C subsequent to forming a capacitor layer 646 on the top surface of the TSVs 616. As shown in FIG. 6C, the capacitor layer 646 may be a MIM capacitor layer, and may include a first metal layer 646-1, an insulating material layer 633, and a second metal layer 646-2. The first metal layer 646-1 may be formed on the top surface of the backside layer 617 using any suitable technique, for example, any of the processes described above with reference to FIG. 5. The first metal layer may be formed of any suitable conductive material, such as copper. The insulating material layer 633 may be formed over the first metal layer 646-1 using any suitable process, including lamination, slit coating and curing, sputtering or sputtering followed by laser annealing. The insulating material layer 633 may be formed of any suitable insulating material. In some embodiments, the insulating material layer 633 is a dielectric material. In some embodiments, a high k dielectric material and/or thin dielectric layers may be formed to maximize capacitance density. In some embodiments, the dielectric material may include titanium oxide, aluminum oxide, hafnium oxide, barium titanate, barium strontium titanate, lead zirconium titanate, zirconium silicate or zirconium oxide. In some embodiments, the dielectric material may include an organic dielectric material such as BT resin, polyimide materials, or a resin doped with high k inorganic fillers. The second metal layer 646-2 may be formed over the insulating material layer 633 using any suitable technique, for example, any of the processes described above with reference to FIG. 5. The second metal layer 646-2 may be formed of any suitable conductive material, such as copper, silver, aluminum or titanium. The conductive vias 635 connecting the first metal layer 646-1 and the second metal layer 646-2 for forming MCI connections to the TSVs 616 may be formed using one or more suitable processes, and the processed employed may depend on the process used to form the insulating material layer 633. For example, when a thin dielectric material is deposited, the vias may be formed by lithographically etching the dielectric material and then depositing the conductive material. In another example, when a lamination process is used to deposit the insulating material layer, the vias may be created using laser ablation. In some embodiments, the vias may be formed prior to forming the insulating material layer 633 by depositing, exposing, and developing a photoresist layer on the top surface of the first metal layer 646-1. The photoresist layer may be patterned to form cavities in the shape of the conductive vias 635. Conductive material, such as copper, may be deposited in the openings in the patterned photoresist layer to form the conductive vias 635. The conductive material may be deposited using any suitable process, such as electroplating, sputtering, or electroless plating. The photoresist may be removed to expose the conductive vias 635. The insulating material layer 633 may be deposited over the conductive vias 635 using, for example, a lamination process, and, if the insulating material is deposited to cover the top surface of the conductive vias 635, the insulating material layer 633 may be removed by any suitable technique, such as polishing or grinding to exposing the top surface of the conductive vias 635 prior to forming the second metal layer 646-2.

Figure 6D:
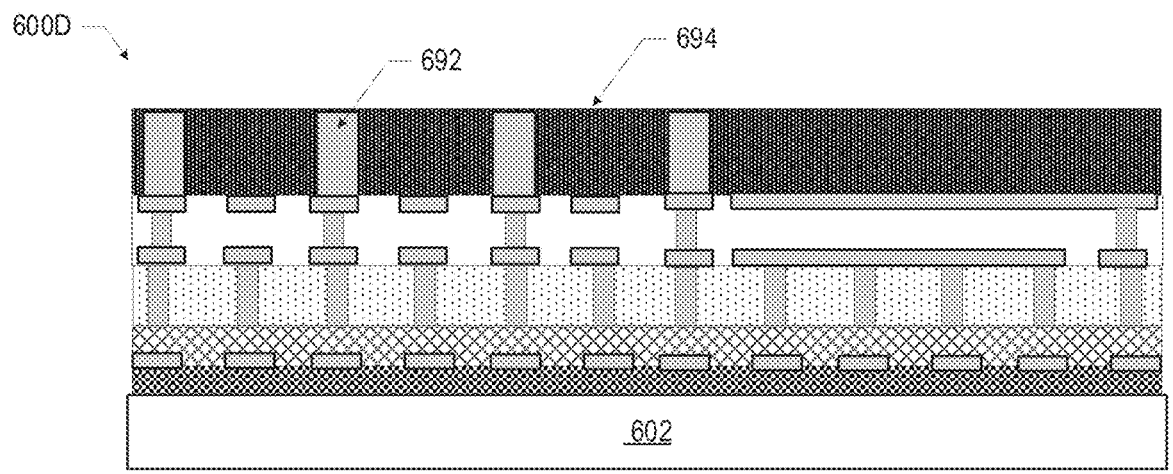

FIG. 6D illustrates an assembly 600D subsequent to forming conductive pillars 692 on the top surface of the capacitor layer 646 and providing a magnetic material 694 around the conductive pillars 692. The conductive pillars 692 may take the form of any of the embodiments disclosed herein, and may be formed using any suitable technique, for example, any of the processes described above with reference to FIG. 5. For example, the conductive pillars 692 may be formed by depositing, exposing, and developing a photoresist layer on the top surface of the second metal layer 646-2 of the capacitor layer 646. The photoresist layer may be patterned to form cavities in the shape of the conductive pillars. Conductive material, such as copper, may be deposited in the openings in the patterned photoresist layer to form the conductive pillars 692. The conductive material may be depositing using any suitable process, such as electroplating, sputtering, or electroless plating. The photoresist may be removed to expose the conductive pillars 692. In another example, a photo-imageable dielectric may be used to form the conductive pillars 692. The conductive pillars may have any suitable dimensions and shape, as described above with reference to FIG. 5. The magnetic material 694 may be deposited using any suitable technique, such as compression molding, lamination, stencil printing, stenciless printing, electroplating, or sputtering. In some embodiments, the magnetic material is cured subsequent to deposition. In some embodiments, the magnetic material 694 may be initially deposited on and over the tops of the conductive pillars 692, then, polished back to expose the top surfaces of the conductive pillars 692. The technique used to deposit the magnetic material may depend on the type of magnetic material used. In some embodiments, the magnetic material used may depend on the desired characteristics for a particular MCI. The magnetic material 694 may be any suitable magnetic material as described above with reference to FIG. 1.

Figure 6E:
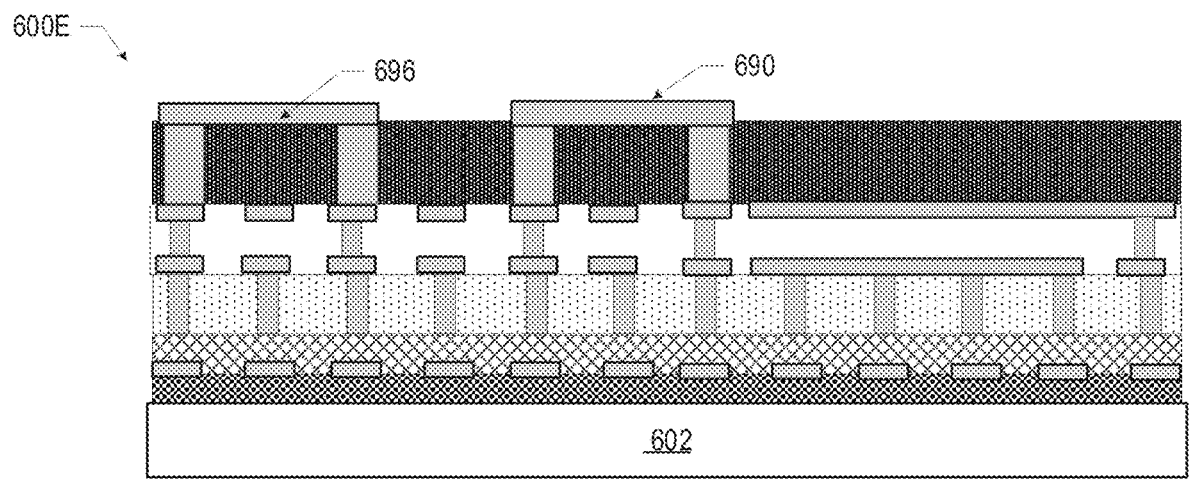

FIG. 6E illustrates an assembly 600E subsequent to forming conductive pathways 696 on the top surfaces of the conductive pillars 692 to form MCIs 690. The conductive pathways 696 may be formed using any suitable technique, for example, any of the processes described any with reference to FIG. 5. For example, the conductive pathways 696 may be formed by depositing, exposing, and developing a photoresist layer on the top surface of the conductive pillars 692. The photoresist layer may be patterned to form cavities in the shape of the conductive pathways 696. Conductive material, such as copper, may be deposited in the openings in the patterned photoresist layer to form the conductive pathways 696. The conductive material may be depositing using any suitable process, such as electroplating, sputtering, or electroless plating. The photoresist may be removed to expose the conductive pathways 696.

Figure 6F:
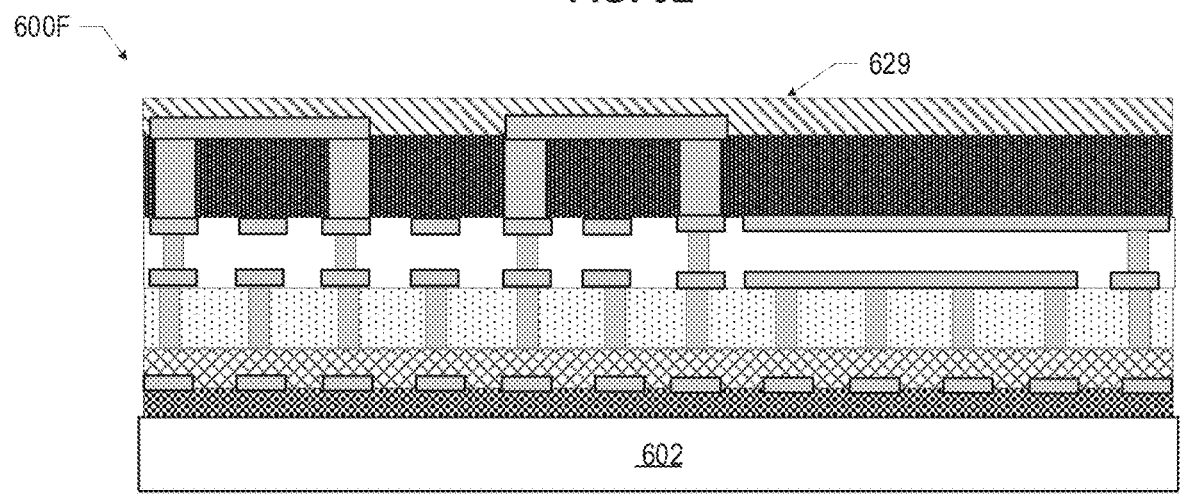

FIG. 6F illustrates an assembly 600F subsequent to providing a high thermally conductive material or TIM 629 on and over the conductive pathways 696. and top surface of the magnetic material 694. The TIM 629 may be formed using any suitable technique, including lamination, or slit coating and curing. The TIM 629 may be any suitable TIM material as described above with reference to FIG. 1.

Figure 6G:
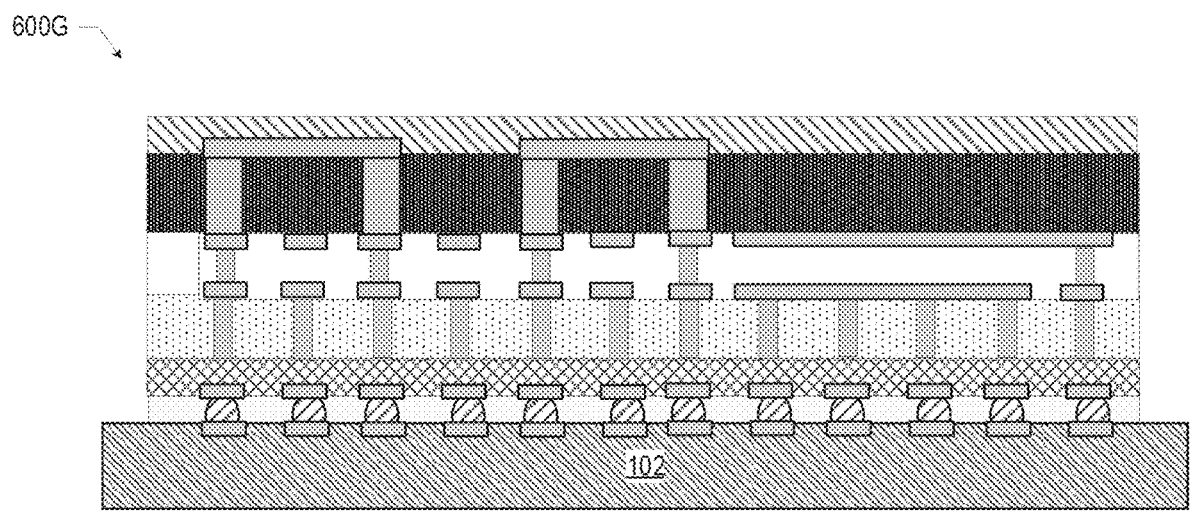

FIG. 6G illustrates an assembly 600G subsequent to removal of the carrier 602, and coupling to a package substrate 102. If multiple composite dies are manufactured together, the composite dies may be singulated after removal of the carrier 602. Further operations may be performed as suitable either before or after singulating (e.g., depositing a mold material, attaching a heat spreader, depositing a solder resist layer, attaching solder balls for coupling to a package substrate or to a circuit board, etc.).

Figure 7:
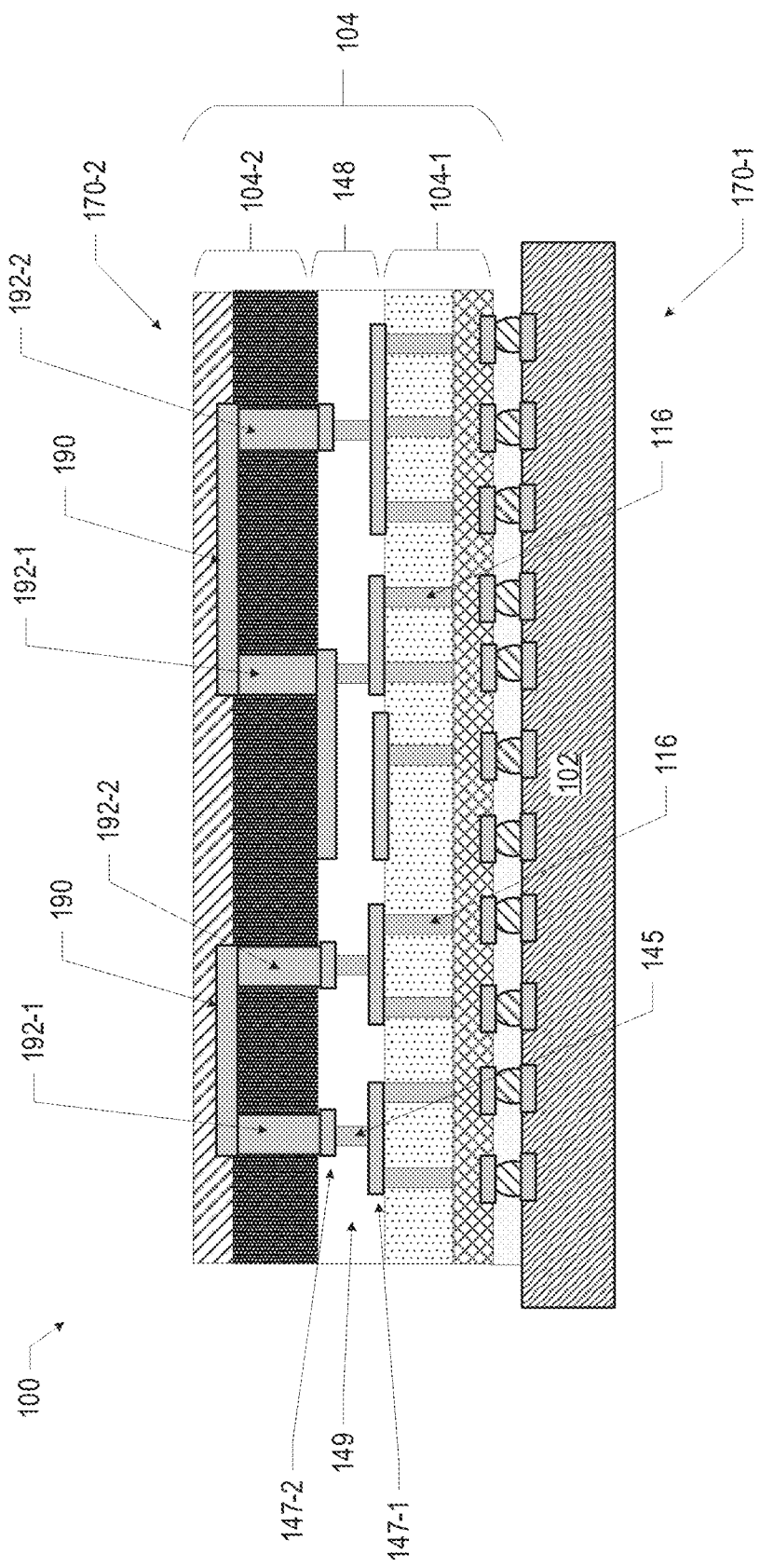
FIG. 7 is a side, cross-sectional view of another example microelectronic assembly, in accordance with various embodiments.

FIG. 7 is a side, cross-sectional view of another example microelectronic assembly, in accordance with various embodiments. The microelectronic assembly 100 may include MCIs 190 having a first conductive pillar 192-1 and/or a second conductive pillar 192-2 coupled to more than one TSV 116. In the microelectronic assemblies 100 disclosed herein, the multi-layer die subassembly 104 may include a capacitor layer 148, such as a MIM capacitor, or a similar layer for forming conductive pathways (e.g., traces and vias) between the TSVs 116 and the MCIs 190. For example, FIG. 7 illustrates an embodiment of a microelectronic assembly 100 in which a multi-layer die subassembly 104 has a capacitor layer 148 between the first layer 104-1 and the second layer 104-2. The capacitor layer 148 may include a first metal layer 147-1, a dielectric layer 149, and a second metal layer 147-2. The first metal layer 147-1 may function as a conductive contact for an MCI 190 to couple to two or more TSVs 116. The second metal layer 147-2 may function as a conductive contact for an MCI 190. As shown in FIG. 7, the MIM conductive contacts for an MCI 190 may be coupled by a conductive via 145.

Although the microelectronic assemblies 100 disclosed herein show a particular number and arrangement of MCIs, TSVs, and interconnects, any number and arrangement of MCIs, TSVs, and interconnects may be used. Further, the microelectronic assemblies 100 disclosed herein may include any number and arrangement of capacitors, including any number of capacitor layers. Although the microelectronic assemblies 100 disclosed herein show a particular number and arrangement of components, the microelectronic assemblies 100 may have any number and arrangement of components.

The microelectronic assemblies 100 disclosed herein may be used for any suitable application. For example, in some embodiments, a microelectronic assembly 100 may be used to enable very small form factor voltage regulation for field programmable gate array (FPGA) or processing units (e.g., a central processing unit, a graphics processing unit, a FPGA, a modem, an applications processor, etc.) especially in mobile devices and small form factor devices. In another example, the die 114 in a microelectronic assembly 100 may be a processing device (e.g., a central processing unit, a graphics processing unit, a FPGA, a modem, an applications processor, etc.).

The microelectronic assemblies 100 disclosed herein may be included in any suitable electronic component. FIGS. 8-11 illustrate various examples of apparatuses that may include, or be included in, any of the microelectronic assemblies 100 disclosed herein.

Figure 8:
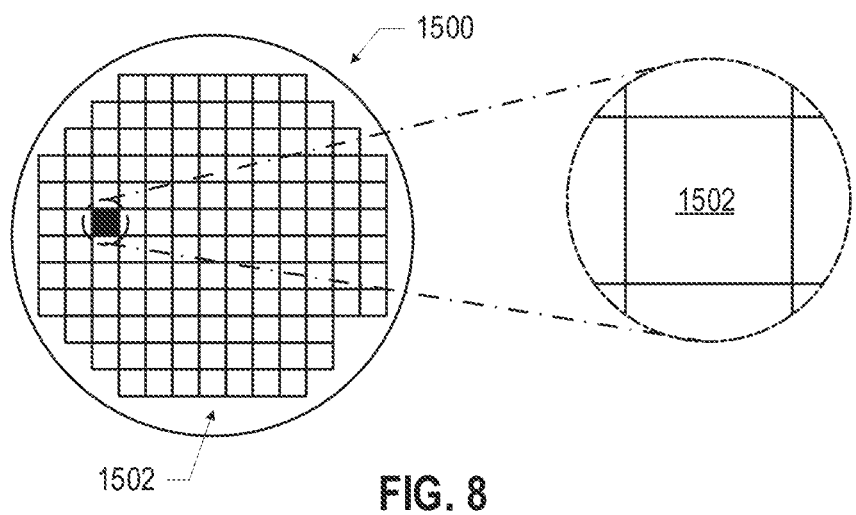
FIG. 8 is a top view of a wafer and dies that may be included in a microelectronic assembly, in accordance with any of the embodiments disclosed herein.

FIG. 8 is a top view of a wafer 1500 and dies 1502 that may be included in any of the microelectronic assemblies 100 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 9, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array. In some embodiments, a die 1502 (e.g., a die 114) may be a central processing unit, a radio frequency chip, a power converter, or a network processor. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 9:
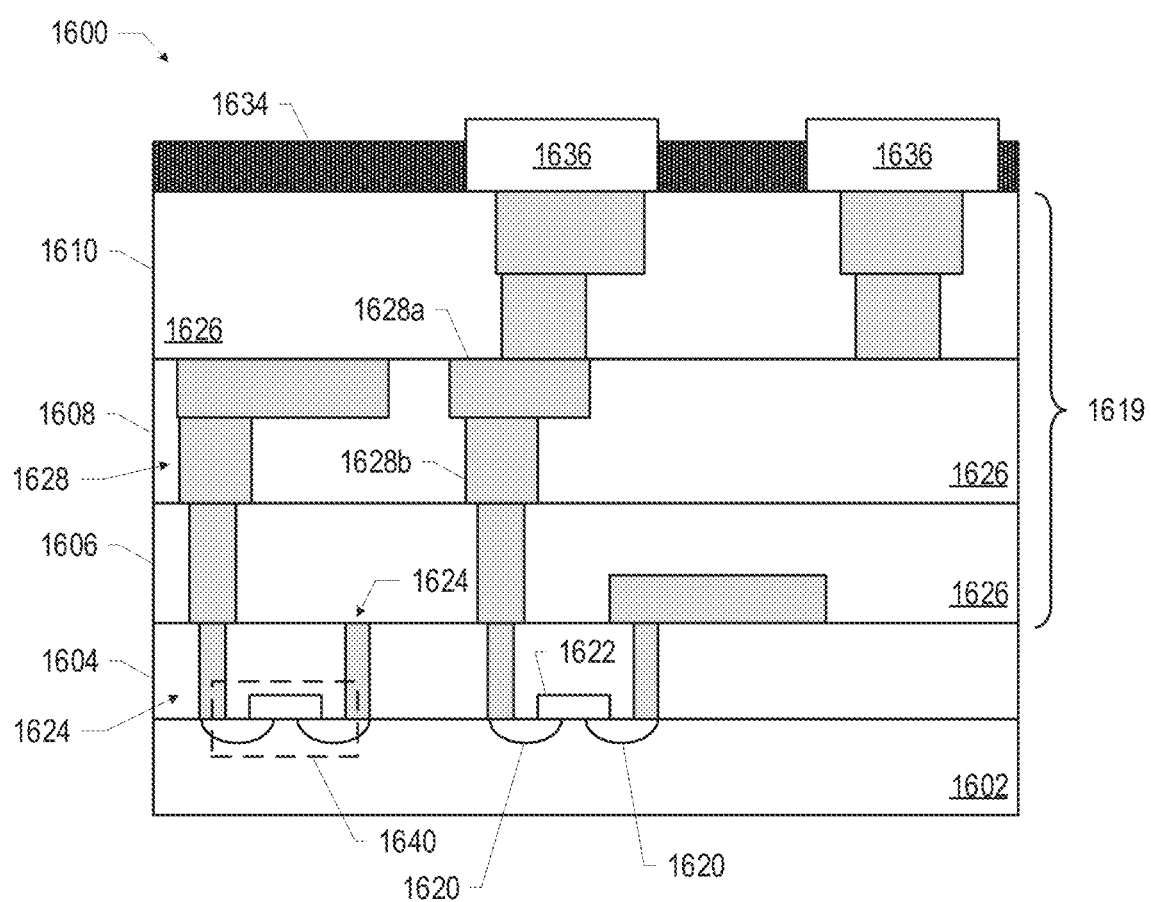
FIG. 9 is a cross-sectional side view of an IC device that may be included in a microelectronic assembly, in accordance with any of the embodiments disclosed herein.

FIG. 9 is a cross-sectional side view of an IC device 1600 that may be included in any of the microelectronic assemblies 100 disclosed herein (e.g., in any of the dies 114). One or more of the IC devices 1600 may be included in one or more dies 1502 (FIG. 8). The IC device 1600 may be formed on a die substrate 1602 (e.g., the wafer 1500 of FIG. 8) and may be included in a die (e.g., the die 1502 of FIG. 8). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 8) or a wafer (e.g., the wafer 1500 of FIG. 8).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a PMOS or a NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group Ill-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 9. Although a particular number of interconnect layers 1606-1610 is depicted in FIG. 9, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the die substrate 1602 upon which the device layer 1604 is formed. For example, the lines 1628*a* may route electrical signals in a direction in and out of the page from the perspective of FIG. 9. The vias 1628*b* may be arranged to route electrical signals in a direction of a plane that is substantially perpendicular to the surface of the die substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 10:
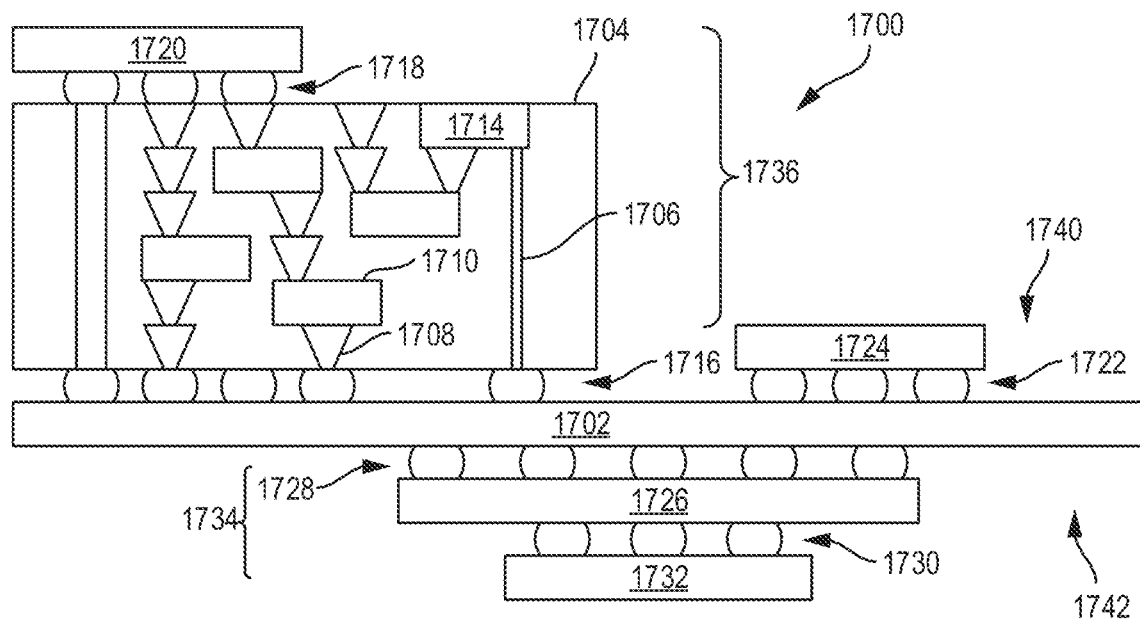
FIG. 10 is a cross-sectional side view of an IC device assembly that may include a microelectronic assembly, in accordance with any of the embodiments disclosed herein.

FIG. 10 is a cross-sectional side view of an IC device assembly 1700 that may include any of the microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 10, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group Ill-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
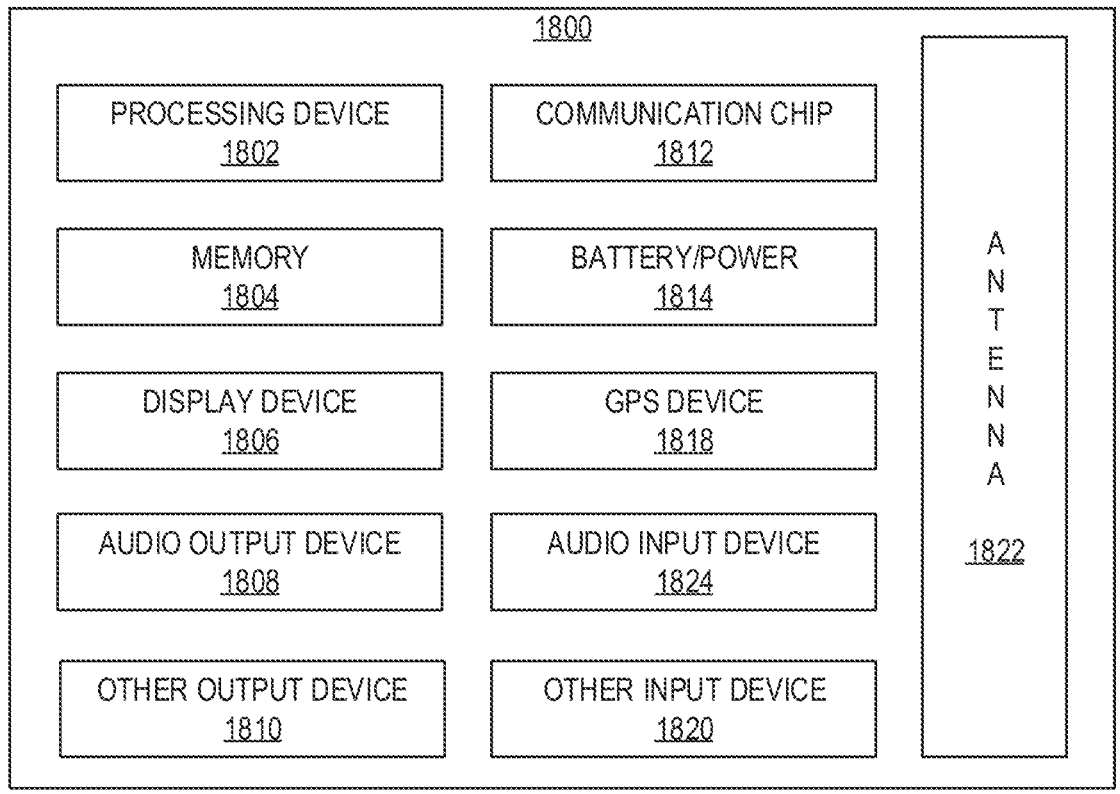
FIG. 11 is a block diagram of an example electrical device that may include a microelectronic assembly, in accordance with any of the embodiments disclosed herein.

FIG. 11 is a block diagram of an example electrical device 1800 that may include one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMLS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a hand-held, portable or mobile computing device (e.g., a cell phone, a smart phone, a mobile internet device, a music player, a tablet computer, a laptop computer, a netbook computer, an ultra-book computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable computing device. In some embodiments, the electrical device 1800 may be any other electronic device that processes data.

The following paragraphs provide various examples of the embodiments disclosed herein.

Example 1 is a microelectronic assembly, including: a package substrate; and a die, including: an active layer having a first surface and an opposing second surface, wherein the first surface of the active layer of the die is coupled to a surface of the package substrate; a backside layer on the second surface of the active layer, wherein the backside layer includes a plurality of through silicon vias (TSVs); and an inductor layer on the backside layer, including: a first conductive pillar having a first end and an opposing second end, wherein the first end of the first conductive pillar is electrically coupled to a first individual TSV of the plurality of TSVs in the backside layer; a second conductive pillar having a first end and an opposing second end, wherein the first end of the second conductive pillar is electrically coupled to a second individual TSV of the plurality of TSVs in the backside layer, a conductive pathway electrically coupling the second end of the first conductive pillar to the second end of the second conductive pillar; and a magnetic material at least partially surrounding the first conductive pillar and the second conductive pillar.

Example 2 may include the subject matter of Example 1, and may further include: a metal-insulator-metal (MIM) capacitor between the backside layer and the inductor layer.

Example 3 may include the subject matter of Example 1, and may further specify that the first conductive pillar is further coupled to a third individual TSV of the plurality of TSVs.

Example 4 may include the subject matter of Example 1, and may further specify that the magnetic material includes one or more of: iron, nickel, cobalt, ferrite, a Heusler alloy, a permalloy, and a dielectric with magnetic particles or flakes.

Example 5 may include the subject matter of Example 1, and may further specify that the inductor layer further includes: a third conductive pillar having a first end and an opposing second end, wherein the first end of the third conductive pillar is electrically coupled to a third individual TSV of the plurality of TSVs in the backside layer; a fourth conductive pillar having a first end and an opposing second end, wherein the first end of the fourth conductive pillar is electrically coupled to a fourth individual TSV of the plurality of TSVs in the backside layer, a second conductive pathway electrically coupling the second end of the third conductive pillar to the second end of the fourth conductive pillar; and the magnetic material at least partially surrounding the third conductive pillar and the fourth conductive pillar.

Example 6 may include the subject matter of Example 1, and may further include: a thermal interface material on the second end of the first and second conductive pillars.

Example 7 may include the subject matter of Example 6, and may further include: a heat spreader on the thermal interface material.

Example 8 is an integrated circuit (IC) die, including: an active layer having a first surface and an opposing second surface; a backside layer on the second surface of the active layer, wherein the backside layer includes a plurality of through silicon vias (TSVs); and an inductor, including: a first conductive pillar having a first end and an opposing second end, wherein the first end of the first conductive pillar is electrically coupled to a first individual TSV of the plurality of TSVs in the backside layer; a second conductive pillar having a first end and an opposing second end, wherein the first end of the second conductive pillar is electrically coupled to a second individual TSV of the plurality of TSVs in the backside layer; and a conductive pathway electrically coupling the second end of the first conductive pillar to the second end of the second conductive pillar.

Example 9 may include the subject matter of Example 8, and may further specify that the first conductive pillar and the second conductive pillar are at least partially surrounded by a magnetic material.

Example 10 may include the subject matter of Example 9, and may further specify that the magnetic material includes one or more of: iron, nickel, cobalt, ferrite, a Heusler alloy, a permalloy, and a dielectric with magnetic particles or flakes.

Example 11 may include the subject matter of Example 8, and may further include: a metal-insulator-metal (MIM) capacitor between the backside layer and the first end of the first conductive pillar and the first end of the second conductive pillar.

Example 12 may include the subject matter of Example 8, and may further specify that the first conductive pillar includes one or more of: copper, silver, nickel, gold, and aluminum.

Example 13 may include the subject matter of Example 8, and may further specify that a pitch of the first conductive pillar and the second conductive pillar is between 50 microns and 1000 microns.

Example 14 may include the subject matter of Example 8, and may further specify that the inductor is a first inductor, and may further include: a second inductor including: a first conductive pillar having a first end and an opposing second end, wherein the first end of the first conductive pillar is electrically coupled to a first individual TSV of the plurality of TSVs in the backside layer; a second conductive pillar having a first end and an opposing second end, wherein the first end of the second conductive pillar is electrically coupled to a second individual TSV of the plurality of TSVs in the backside layer; and a conductive pathway electrically coupling the second end of the first conductive pillar to the second end of the second conductive pillar.

Example 15 may include the subject matter of Example 14, and may further specify that a distance between the second conductive pillar of the first inductor and the first conductive pillar of the second inductor is between 50 microns and 4000 microns.

Example 16 is a computing device, including: a package substrate having a first surface and an opposing second surface; and a die, including: an active layer having a first surface and an opposing second surface, wherein the first surface of the active layer is coupled to the second surface of the package substrate; a backside layer on the second surface of the active layer, wherein the backside layer includes a plurality of through silicon vias (TSVs); a first conductive pillar having a first end and an opposing second end, wherein the first end of the first conductive pillar is electrically coupled to a first individual TSV of the plurality of TSVs via a first connection on the second surface of the die, and wherein the first conductive pillar is at least partially surrounded by a magnetic material; and a second conductive pillar having a first end and an opposing second end, wherein the first end of the second conductive pillar is electrically coupled to a second individual TSV of the plurality of TSVs via a second connection on the second surface of the die, and wherein the first conductive pillar is coupled to the second conductive pillar via a conductive pathway extending from the second end of the first conductive pillar to the second end of the second conductive pillar.

Example 17 may include the subject matter of Example 16, and may further include: a metal-insulator-metal (MIM) capacitor between the backside layer and the first end of the first conductive pillar and the first end of the second conductive pillar.

Example 18 may include the subject matter of Example 16, and may further specify that the first conductive pillar is further coupled to a third individual TSV of the plurality of TSVs.

Example 19 may include the subject matter of Example 16, and may further specify that the magnetic material includes one or more of: iron, nickel, cobalt, ferrite, a Heusler alloy, a permalloy, and a dielectric with magnetic particles or flakes.

Example 20 may include the subject matter of Example 16, and may further specify that the die is a central processing unit, a radio frequency chip, a power converter, or a network processor.

Example 21 may include the subject matter of Example 16, and may further include: a circuit board, wherein the first surface of the package substrate is coupled to a surface of the circuit board.

Example 22 may include the subject matter of Example 16, and may further specify that the computing device is a server.

Example 23 may include the subject matter of Example 16, and may further specify that the computing device is a portable computing device.

Example 24 may include the subject matter of Example 16, and may further specify that the computing device is a wearable computing device.

Example 25 may include the subject matter of Example 16, and may further specify that the package substrate is a printed circuit board.

Example 26 is a method of manufacturing a microelectronic assembly, including: forming a first conductive pillar, having a first surface and an opposing second surface, on a die having a plurality of through silicon vias (TSVs), wherein the first surface of the first conductive pillar is coupled to a first individual TSV of the plurality of TSVs on the die; forming a second conductive pillar, having a first surface and an opposing second surface, on the die, wherein the first surface of the second conductive pillar is coupled to a second individual TSV of the plurality of TSVs on the die; forming a magnetic material at least partially around the first conductive pillar; and forming a conductive pathway between the second surface of the first conductive pillar and the second surface of the second conductive pillar.

Example 27 may include the subject matter of Example 26, and may further specify that the magnetic material includes one or more of: iron, nickel, cobalt, ferrite, a Heusler alloy, a permalloy, and a dielectric with magnetic particles or flakes.

Example 28 may include the subject matter of Example 26, and may further include: forming the magnetic material at least partially around the second conductive pillar.

Example 29 may include the subject matter of Example 26, and may further include: forming a metal-insulator-metal capacitor between the plurality of TSVs and the first ends of the first and second conductive pillars.

Example 30 may include the subject matter of Example 26, and may further include: forming a thermal interface material on the second surface of the first and second conductive pillars.

The invention claimed is:

1. A microelectronic assembly, comprising:
   a package substrate; and
   a die, including:
      an active layer having a first surface and an opposing second surface, wherein the first surface of the active layer of the die is coupled to a surface of the package substrate;
      a backside layer on the second surface of the active layer, wherein the backside layer includes a plurality of through silicon vias (TSVs); and
      an inductor layer on the backside layer, including:
         a first conductive pillar having a first end and an opposing second end, wherein the first end of the first conductive pillar is electrically coupled to a first individual TSV of the plurality of TSVs in the backside layer;
         a second conductive pillar having a first end and an opposing second end, wherein the first end of the second conductive pillar is electrically coupled to a second individual TSV of the plurality of TSVs in the backside layer,
         a conductive pathway electrically coupling the second end of the first conductive pillar to the second end of the second conductive pillar; and
         a magnetic material at least partially surrounding the first conductive pillar and the second conductive pillar.

2. The microelectronic assembly of claim 1, further comprising:
   a metal-insulator-metal (MIM) capacitor between the backside layer and the inductor layer.

3. The microelectronic assembly of claim 1, wherein the first conductive pillar is further coupled to a third individual TSV of the plurality of TSVs.

4. The microelectronic assembly of claim 1, wherein the magnetic material comprises one or more of: iron, nickel, cobalt, ferrite, a Heusler alloy, a permalloy, and a dielectric with magnetic particles or flakes.

5. The microelectronic assembly of claim 1, wherein the inductor layer further includes:
   a third conductive pillar having a first end and an opposing second end, wherein the first end of the third conductive pillar is electrically coupled to a third individual TSV of the plurality of TSVs in the backside layer;
   a fourth conductive pillar having a first end and an opposing second end, wherein the first end of the fourth conductive pillar is electrically coupled to a fourth individual TSV of the plurality of TSVs in the backside layer,
   a second conductive pathway electrically coupling the second end of the third conductive pillar to the second end of the fourth conductive pillar; and
   the magnetic material at least partially surrounding the third conductive pillar and the fourth conductive pillar.

6. The microelectronic assembly of claim 1, further comprising:
a thermal interface material on the second end of the first and second conductive pillars.

7. The microelectronic assembly of claim 6, further comprising:
a heat spreader on the thermal interface material.

8. An integrated circuit (IC) die, comprising:
an active layer having a first surface and an opposing second surface;
a backside layer on the second surface of the active layer, wherein the backside layer includes a plurality of through silicon vias (TSVs); and
an inductor, including:
a first conductive pillar having a first end and an opposing second end, wherein the first end of the first conductive pillar is electrically coupled to a first individual TSV of the plurality of TSVs in the backside layer;
a second conductive pillar having a first end and an opposing second end, wherein the first end of the second conductive pillar is electrically coupled to a second individual TSV of the plurality of TSVs in the backside layer; and
a conductive pathway electrically coupling the second end of the first conductive pillar to the second end of the second conductive pillar.

9. The IC die of claim 8, wherein the first conductive pillar and the second conductive pillar are at least partially surrounded by a magnetic material.

10. The IC die of claim 9, wherein the magnetic material comprises one or more of: iron, nickel, cobalt, ferrite, a Heusler alloy, a permalloy, and a dielectric with magnetic particles or flakes.

11. The IC die of claim 8, further comprising:
a metal-insulator-metal (MIM) capacitor between the backside layer and the first end of the first conductive pillar and the first end of the second conductive pillar.

12. The IC die of claim 8, wherein the first conductive pillar comprises one or more of: copper, silver, nickel, gold, and aluminum.

13. The IC die of claim 8, wherein a pitch of the first conductive pillar and the second conductive pillar is between 50 microns and 1000 microns.

14. The IC die of claim 8, wherein the inductor is a first inductor, further comprising:
a second inductor including:
a first conductive pillar having a first end and an opposing second end, wherein the first end of the first conductive pillar is electrically coupled to a first individual TSV of the plurality of TSVs in the backside layer;
a second conductive pillar having a first end and an opposing second end, wherein the first end of the second conductive pillar is electrically coupled to a second individual TSV of the plurality of TSVs in the backside layer; and
a conductive pathway electrically coupling the second end of the first conductive pillar to the second end of the second conductive pillar.

15. The IC die of claim 14, wherein a distance between the second conductive pillar of the first inductor and the first conductive pillar of the second inductor is between 50 microns and 4000 microns.

16. A computing device, comprising:
a package substrate having a first surface and an opposing second surface; and
a die, including:
an active layer having a first surface and an opposing second surface, wherein the first surface of the active layer is coupled to the second surface of the package substrate;
a backside layer on the second surface of the active layer, wherein the backside layer includes a plurality of through silicon vias (TSVs);
a first conductive pillar having a first end and an opposing second end, wherein the first end of the first conductive pillar is electrically coupled to a first individual TSV of the plurality of TSVs via a first connection on the second surface of the die, and wherein the first conductive pillar is at least partially surrounded by a magnetic material; and
a second conductive pillar having a first end and an opposing second end, wherein the first end of the second conductive pillar is electrically coupled to a second individual TSV of the plurality of TSVs via a second connection on the second surface of the die, and wherein the first conductive pillar is coupled to the second conductive pillar via a conductive pathway extending from the second end of the first conductive pillar to the second end of the second conductive pillar.

17. The computing device of claim 16, wherein the die is a central processing unit, a radio frequency chip, a power converter, or a network processor.

18. The computing device of claim 16, wherein the computing device is a server.

19. The computing device of claim 16, wherein the computing device is a portable computing device.

20. The computing device of claim 16, wherein the computing device is a wearable computing device.

21. A method of manufacturing a microelectronic assembly, comprising:
forming a first conductive pillar, having a first surface and an opposing second surface, on a die having a plurality of through silicon vias (TSVs), wherein the first surface of the first conductive pillar is coupled to a first individual TSV of the plurality of TSVs on the die;
forming a second conductive pillar, having a first surface and an opposing second surface, on the die, wherein the first surface of the second conductive pillar is coupled to a second individual TSV of the plurality of TSVs on the die;
forming a magnetic material at least partially around the first conductive pillar; and
forming a conductive pathway between the second surface of the first conductive pillar and the second surface of the second conductive pillar.

22. The method of claim 21, wherein the magnetic material includes one or more of: iron, nickel, cobalt, ferrite, a Heusler alloy, a permalloy, and a dielectric with magnetic particles or flakes.

23. The method of claim 21, further comprising:
forming the magnetic material at least partially around the second conductive pillar.

24. The method of claim 21, further comprising:
forming a metal-insulator-metal capacitor between the plurality of TSVs and the first ends of the first and second conductive pillars.

25. The method of claim 21, further comprising:
forming a thermal interface material on the second surface of the first and second conductive pillars.

* * * * *